United States Patent
Fukunaga (10) Patent No.: US 6,621,845 B2
(45) Date of Patent: Sep. 16, 2003

(54) SEMICONDUCTOR LASER DEVICE WHICH INCLUDES ALGAAS OPTICAL WAVEGUIDE LAYER BEING FORMED OVER INTERNAL STRIPE GROOVE AND HAVING CONTROLLED REFRACTIVE INDEX

(75) Inventor: Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/981,258

(22) Filed: Oct. 18, 2001

(65) Prior Publication Data

US 2002/0044584 A1 Apr. 18, 2002

(30) Foreign Application Priority Data

Oct. 18, 2000 (JP) ........................................ 2000-317650

(51) Int. Cl.$^7$ ................................................. H01S 5/00
(52) U.S. Cl. ........................................... 372/46; 372/45
(58) Field of Search ..................................... 372/45, 46

(56) References Cited

U.S. PATENT DOCUMENTS

| | | | | |
|---|---|---|---|---|
| 5,400,354 A | * | 3/1995 | Ludowise et al. | 372/46 |
| 6,049,556 A | * | 4/2000 | Sato | 372/46 |
| 6,233,264 B1 | * | 5/2001 | Sato | 372/45 |

FOREIGN PATENT DOCUMENTS

| | | | | |
|---|---|---|---|---|
| JP | 2001-53383 | | 2/2001 | ........... H01S/5/223 |
| JP | 2001053383 | * | 2/2001 | ........... H01S/5/223 |

OTHER PUBLICATIONS

T.Fujimoto, Yumi Yamada, Yoshikazu Yamada, A. Okubo, Y.Oeda, and K. Muro "High Power InGaAs/AlGaAs laser diodes with decoupled confinement heterostructure", 1999, vol. 3628, pp. 38–45.

* cited by examiner

Primary Examiner—Paul Ip
Assistant Examiner—Tuan Nguyen
(74) Attorney, Agent, or Firm—Sughrue Mion, PLLC (57) ABSTRACT

In a semiconductor laser device having an InGaAsP compressive strain quantum well active layer, an InGaAsP first upper optical waveguide layer formed on the active layer, and a current confinement layer which is formed above the first upper optical waveguide layer and includes a stripe groove. An AlGaAs second upper optical waveguide layer having an approximately identical refractive index to that of the first upper optical waveguide layer covers the current confinement layer and the stripe groove. The product of the strain and the thickness of the active layer does not exceed 0.25 nm. All the layers other than the compressive strain quantum well active layer lattice-match with GaAs. An AlGaAs or InGaAsP upper cladding layer formed above the second upper optical waveguide layer has an approximately identical refractive index to that of a lower cladding layer formed under the active layer.

11 Claims, 3 Drawing Sheets

TEMPERATURE DEPENDENCY OF THRESHOLD CURRENT

SEMICONDUCTOR LASER DEVICE WHICH INCLUDES ALGAAS OPTICAL WAVEGUIDE LAYER BEING FORMED OVER INTERNAL STRIPE GROOVE AND HAVING CONTROLLED REFRACTIVE INDEX

BACKGROUND OF THE INVENTION

1. Field of the Invention

The present invention relates to a semiconductor laser device having a compressive strain quantum well active layer above a GaAs substrate.

2. Description of the Related Art

Fujimoto et al. ("High Power InGaAs/AlGaAs laser diodes with decoupled confinement heterostructure," Proceedings of SPIE, Vol. 3628 (1999) pp. 38–45) discloses an internal striped structure semiconductor laser device which emits light in the 0.98 Mm band. This semiconductor laser device is formed as follows.

On an n-type GaAs substrate, an n-type $Al_xGa_{1-x}As$ lower cladding layer, an n-type GaAs optical waveguide layer, an InGaAs quantum well active layer, a p-type GaAs first upper optical waveguide layer, and an n-type $Al_yGa_{1-y}As$ current confinement layer are formed in this order. Next, a narrow-stripe groove is formed, by conventional photolithography and selective etching, to such a depth that the groove penetrates the n-type AlGaAs current confinement layer. Thereafter, over the above structure, a GaAs second optical waveguide layer, a p-type AlGaAs upper cladding layer, and a p-type GaAs contact layer are formed. Thus, an internal striped structure is formed, and the semiconductor laser device oscillates in a fundamental transverse mode.

In the above semiconductor laser device, the stripe width can be controlled accurately, and high-output-power oscillation in the fundamental transverse mode can be realized by the difference in the refractive index between the n-type AlGaAs current confinement layer and the p-type GaAs second optical waveguide layer. However, the above semiconductor laser device has a drawback that it is difficult to form a GaAs layer on another AlGaAs layer, since the AlGaAs layers are prone to oxidation. In addition, since the optical waveguide layers are made of GaAs, current leakage is likely to occur. Therefore, AlGaAs leak-current protection layers are provided on both sides of the active layer. Nevertheless, the leakage current is still great, and thus the threshold current is high.

On the other hand, in order to prevent degradation of characteristics of the semiconductor laser device due to oxidation of aluminum included in an exposed regrowth boundary, T. Fukunaga (the inventor of the present patent application) and M. Wada have proposed a semiconductor laser device and a method of producing the semiconductor laser device in a coassigned and copending U.S. Ser. No. 09/634,703, filed on Aug. 7, 2000 and entitled "HIGH-POWER SEMICONDUCTOR LASER DEVICE HAVING CURRENT CONFINEMENT STRUCTURE AND INDEX-GUIDED STRUCTURE," corresponding to Japanese patent application No. 11(1999)-222169, which is disclosed in Japanese Unexamined Patent Publication No. 2001–053383. In the above semiconductor laser device, the optical waveguide layers are made of InGaAsP, which has a greater bandgap than GaAs and does not contain aluminum. In addition, the current confinement layer is made of InGaP. Thus, the semiconductor laser device has a structure in which aluminum is not exposed on the regrowth layer. However, even in this structure, the leakage current is still great, and therefore the threshold current is high, since the band offset between the conduction bands of the InGaAsP and InGaP layers is small.

SUMMARY OF THE INVENTION

An object of the present invention is to provide a reliable semiconductor laser device which includes an internal stripe groove and a regrown layer over an internal stripe groove, and has the following features:

(a) Aluminum, which is prone to oxidation, does not exist on a regrowth boundary.
(b) The leakage current is suppressed by an index-guided structure formed with high precision.
(c) The semiconductor laser device oscillates in a fundamental transverse mode when the stripe width is small.
(d) The semiconductor laser device produces low noise when the stripe width is great.

According to the present invention, there is provided a semiconductor laser device including: a GaAs substrate of a first conductive type; a lower cladding layer of the first conductive type formed above the GaAs substrate; a lower optical waveguide layer formed above the lower cladding layer; a compressive strain quantum well active layer made of $In_{x3}Ga_{1-x3}As_{1-y3}P_{y3}$ and formed above the lower optical waveguide layer, where $0<x3\leq 0.4$ and $0\leq y3\leq 0.1$; a first upper optical waveguide layer made of $In_{x2}Ga_{1-x2}As_{1-y2}P_{y2}$ and formed above the compressive strain quantum well active layer, where $x2=(0.49\pm 0.01)y2$, and $0\leq x2\leq 0.3$; a first etching stop layer made of $In_{x9}Ga_{1-x9}P$ of a second conductive type and formed above the first upper optical waveguide layer, where $0\leq x9\leq 1$; a second etching stop layer made of $In_{x1}Ga_{1-x1}As_{1-y1}P_{y1}$ and formed on the first etching stop layer other than a stripe area of the first etching stop layer so as to form a first portion of a stripe groove realizing a current injection window, where $x1=(0.49\pm 0.01)y1$ and $0\leq x1\leq 0.3$; a current confinement layer made of $In_{0.49}Ga_{0.51}P$ of the first conductive type and formed above the second etching stop layer so as to form a second portion of the stripe groove; a second upper optical waveguide layer made of A GaAs formed so as to cover the current confinement layer and the stripe groove; an upper cladding layer of the second conductive type, made of one of AlGaAs and $In_{x4}Ga_{1-x4}As_{1-y4}P_{y4}$ and formed over the second upper optical waveguide layer, where $x4=(0.49\pm 0.01)y4$, and $0.9\leq y4\leq 1$; a contact layer of the second conductive type; a first electrode formed on an exposed surface of the GaAs substrate; and a second electrode formed on the contact layer. In the semiconductor laser device, the first and second upper optical waveguide layers have an approximately identical refractive index, the upper and lower cladding layers have an approximately identical refractive index, the absolute value of a first product of the strain and the thickness of the compressive strain quantum well active layer is equal to or smaller than 0.25 nm, and each of the lower cladding layer, the lower optical waveguide layer, the first and second upper optical waveguide layers, the first and second etching stop layers, the current confinement layer, the upper cladding layer, and the contact layer has such a composition as to lattice-match with GaAs.

Preferably, the semiconductor laser device according to the present invention may also have one or a combination of the following additional features (i) and (ii).

(i) The semiconductor laser device according to the present invention may further include first and second tensile strain barrier layers both made of $In_{x5}Ga_{1-x5}As_{1-y5}P_{y5}$ and respectively formed above and below the compressive strain quantum well active layer, where $0 \leq x5 \leq 0.3$ and $0 < y5 \leq 0.6$, and the absolute value of the sum of the first product and a second product of the strain of the first and second tensile strain barrier layers and the total thickness of the first and second tensile strain barrier layers is equal to or smaller than 0.25 nm.

(ii) The second etching stop layer may be one of the first and second conductive types.

The strain $\Delta a$ of the compressive strain quantum well active layer is defined as $\Delta a = (ca - cs)/cs$, and the strain $\Delta b$ of the first and second tensile strain barrier layers is defined as $\Delta b = (cb - cs)/cs$, where cs, ca and cb are the lattice constants of the GaAs substrate, the compressive strain quantum well active layer, and the first and second tensile strain barrier layers, respectively.

When a layer grown over the substrate has a lattice constant c, and the absolute value of the amount $\Delta = (c - cs)/cs$ is equal to or smaller than 0.003, the layer is lattice-matched with the (GaAs) substrate.

When the thickness of the compressive strain quantum well active layer is denoted by da, according to the present invention, the above first product of the compressive strain $\Delta a$ and the thickness da of the compressive strain quantum well active layer satisfies the following inequalities, $$0 < \Delta a \times da \leq 0.25 \text{ nm}.$$

In addition, when the semiconductor laser device according to the present invention has the additional feature (i), the absolute value of the sum of the first product and the second product of the strain $\Delta b$ of said first and second tensile strain barrier layers and the total thickness db of the first and second tensile strain barrier layers satisfies the following inequalities, $$-0.25 \text{ nm} \leq \Delta a \times da + \Delta b \times db \leq 0.25 \text{ nm}.$$

Further, in order to substantially equalize the refractive indexes of the first and second upper optical waveguide layers, it is preferable to determine the composition of AlGaAs so that the difference between the refractive indexes of the first and second upper optical waveguide layers does not exceed 0.5%.

The semiconductor laser device according to the present invention has the following advantages.

(a) Because of the above construction, the semiconductor laser device according to the present invention can oscillate in a fundamental transverse mode in a wide range from a low output power to a high output power.

Specifically, in the above semiconductor laser device, a stripe groove is formed in the $In_{0.49}Ga_{0.51}P$ current confinement layer of the first conductive type, and the AlGaAs second upper optical waveguide layer is formed so as to cover the current confinement layer and the stripe groove, where the second upper optical waveguide layer has the refractive index approximately identical to the refractive index of the first upper optical waveguide layer. Therefore, it is possible to maintain a difference in the equivalent refractive index between a portion of the active region under the current injection window and another portion of the active region under the current confinement layer in the range from about $1.5 \times 10^{-3}$ to $7 \times 10^{-3}$. Therefore, it is possible to achieve efficient light confinement, and realize an internal current confinement structure and a real 15 refractive index guided structure with high precision.

(b) Since it is possible to increase the band offset between the conduction bands of the first and second upper optical waveguide layers, the leakage current can be suppressed, and oscillation with low threshold current density can be realized.

(c) When the upper cladding layer is made of AlGaAs having such a composition that the upper cladding layer has an approximately identical refractive index to that of the lower cladding layer, the temperature dependency characteristic of the threshold current can be improved.

(d) In the semiconductor laser device according to the present invention, the $In_{x1}Ga_{1-x1}As_{1-y1}P_{y1}$ second etching stop layer is formed under the $In_{0.49}Ga_{0.51}P$ current confinement layer, and the second conductive type $In_{x9}Ga_{1-x9}P$ first etching stop layer is formed under the $In_{x1}Ga_{1-x1}As_{1-y1}P_{y1}$ second etching stop layer. Therefore, when the current confinement layer is removed by etching with a hydrochloric acid etchant, the $In_{x1}Ga_{1-x1}As_{1-y1}P_{y1}$ second etching stop layer is not removed by etching with the hydrochloric acid etchant. Thus, the etching with the hydrochloric acid etchant can be accurately stopped at the upper surface of the $In_{x1}Ga_{1-x1}As_{1-y1}P_{y1}$ second etching stop layer.

In addition, when etching with a sulfuric acid etchant is used, only the second etching stop layer made of $In_{x1}Ga_{1-x1}As_{1-y1}P_{y1}$ is etched off, and the $In_{x9}Ga_{1-x9}P$ first etching stop layer is not etched. Therefore, the etching with the sulfuric acid etchant can be accurately stopped at the upper surface of the $In_{x9}Ga_{1-x9}P$ first etching stop layer.

Further, even when a GaAs cap layer is formed on the current confinement layer, it is possible to concurrently remove the GaAs cap layer and a portion of the $In_{x1}Ga_{1-x1}As_{1-y1}P_{y1}$ second etching stop layer exposed at the bottom of the stripe groove after the stripe groove is formed.

Furthermore, it is possible to enhance the controllability of the width of the stripe groove in wet etching, and accurately form the index-guided structure and the internal current confinement structure.

(e) Since the current confinement layer is arranged inside the semiconductor laser device, it is possible to increase the contact area between the electrode and the contact layer. Therefore, the contact resistance can be reduced.

(f) Since the layers exposed at the boundary on which the second etching stop layer is formed do not contain aluminum, regrowth of the second etching stop layer on the boundary is easy. In addition, since crystal defects caused by oxidation of aluminum can be reduced, the degradation of the characteristics of the semiconductor laser device can be prevented.

(g) When the first and second tensile strain barrier layers both made of $In_{x5}Ga_{1-x5}As_{1-y5}P_{y5}$ are respectively formed above and below the compressive strain quantum well active layer, various characteristics of the semiconductor laser device are improved (e.g., the threshold current is lowered), and reliability is increased.

DESCRIPTION OF PREFERRED EMBODIMENTS

Embodiments of the present invention are explained in detail below with reference to drawings.

First Embodiment

FIGS. 1A to 1D are diagrams illustrating cross sections of the representative stages in the process for producing a semiconductor laser device as the first embodiment of the present invention.

Figure 1A:
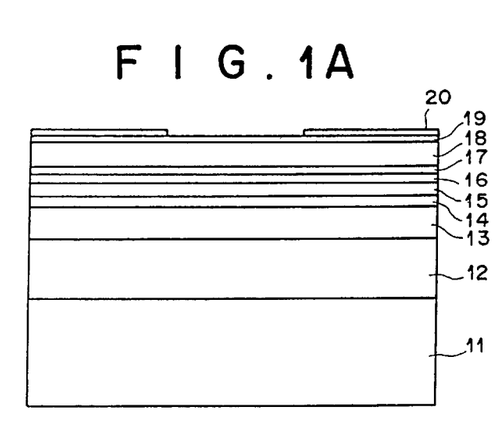
FIGS. 1A to 1D are cross-sectional views of representative stages of a process for producing a semiconductor laser device as a first embodiment of the present invention.

First, as illustrated in FIG. 1A, an n-type $In_{0.49}Ga_{0.51}P$ lower cladding layer 12, an n-type or i-type (intrinsic) $In_{x2}Ga_{1-x2}As_{1-y2}P_{y2}$ lower optical waveguide layer 13 (x2= $(0.49\pm0.01)y2$, $0 \leq y2 < 0.6$), an $In_{x3}Ga_{1-x3}As_{1-y3}P_{y3}$ compressive strain quantum well active layer 14 ($0 < x3 \leq 0.4$, $0 \leq y3 \leq 0.1$), a p-type or i-type $In_{x2}Ga_{1-x2}As_{1-y2}P_{y2}$ first upper optical waveguide layer 15, a p-type $In_{x9}Ga_{1-x9}P$ first etching stop layer 16 ($0 \leq x9 \leq 1$) having a thickness of about 10 nm, a p-type $In_{x1}Ga_{1-x1}As_{1-y1}P_{y1}$ second etching stop layer 17 ($0 \leq x1 \leq 0.3$, $0 \leq y1 \leq 0.3$) having a thickness of about 10 nm, an n-type $In_{0.49}Ga_{0.51}P$ current confinement layer 18 having a thickness of about 1 micrometer, and an n-type GaAs cap layer 19 having a thickness of about 10 nm are formed on an n-type GaAs substrate 11 by organometallic vapor phase epitaxy. Then, a $SiO_2$ film 20 is formed over the n-type GaAs cap layer 19, and a stripe area of the $SiO_2$ film 20 having a width of about 1.5 to 3 micrometers and extending in the <011> direction is removed by conventional lithography.

Figure 1B:
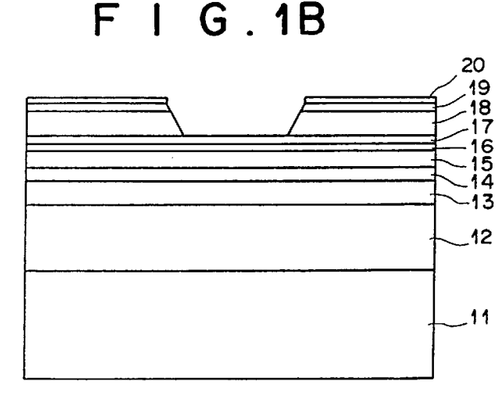

Next, as illustrated in FIG. 1B, the n-type GaAs cap layer 19 is etched with a sulfuric acid etchant by using the remaining areas of the $SiO_2$ film 20 as a mask until a stripe area of the n-type $In_{0.49}Ga_{0.51}P$ current confinement layer 18 is exposed. Then, the exposed area of the n-type $In_{0.49}Ga_{0.51}P$ current confinement layer 18 is etched with a hydrochloric acid etchant until a stripe area of the p-type $In_{x1}Ga_{1-x1}As_{1-y1}P_{y1}$ second etching stop layer 17 is exposed.

Figure 1C:
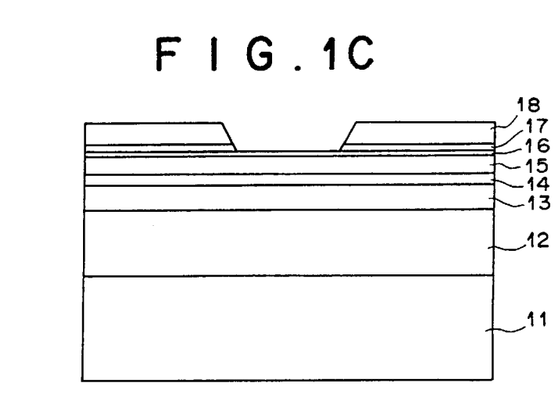

Thereafter, as illustrated in FIG. 1C, the remaining areas of the $SiO_2$ film 20 are removed by a fluoric acid etchant. Then, the remaining areas of the n-type GaAs cap layer 19 and the exposed area of the p-type $In_{x1}Ga_{1-x1}As_{1-y1}P_{y1}$ second etching stop layer 17 are removed by etching with a sulfuric acid etchant so that a stripe area of the p-type $In_{x9}Ga_{1-x9}P$ first etching stop layer 16 is exposed.

Figure 1D:
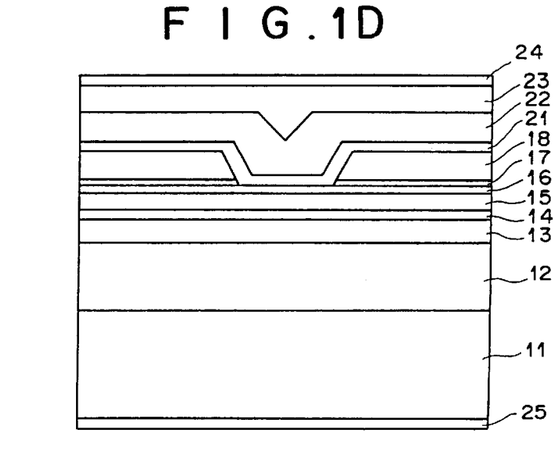

Finally, as illustrated in FIG. 1D, a p-type $Al_{z2}Ga_{1-z2}As$ second upper optical waveguide layer 21, a p-type $In_{0.49}Ga_{0.51}P$ upper cladding layer 22, and a p-type GaAs contact layer 23 are formed over the construction of FIG. 1C. Then, a p electrode 24 is formed on the p-type GaAs contact layer 23. In addition, the exposed (opposite) surface of the substrate 11 is polished, and an n electrode 25 is formed on the polished surface of the substrate 11. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 15 and the p-type $Al_{z2}Ga_{1-z2}As$ second upper optical waveguide layer 21 have such thicknesses and compositions that oscillation in a fundamental transverse mode can be maintained even when output power becomes high. In other words, the p-type or i-type $In_{x2}Ga_{1-x2}As_{1-y2}P_{y2}$ first upper optical waveguide layer 15 and the p-type $Al_{z2}Ga_{1-z2}As$ second upper optical waveguide layer 21 have such thicknesses that an effective refractive index difference realized by the current confinement area and the light emission area (i.e., a difference in the equivalent refractive index between the portion formed in a stacking direction, i.e., a direction perpendicular to the active layer, in relation to the current confinement layer and the portion formed in a stacking direction in relation to the stripe region) becomes about $1.5 \times 10^{-3}$ to $7 \times 10^{-3}$.

In addition, in order to realize the symmetry of the oscillation mode, it is preferable to arrange the p-type $Al_{z2}Ga_{1-z2}As$ second upper optical waveguide layer 21 to have a refractive index approximately identical to the refractive index of the p-type or i-type $In_{x2}Ga_{1-x2}As_{1-y2}P_{y2}$ first upper optical waveguide layer 15. Specifically, it is preferable that the difference in the refractive index between the p-type or i-type $In_{x2}Ga_{1-x2}As_{1-y2}P_{y2}$ first upper optical waveguide layer 15 and the p-type $Al_{z2}Ga_{1-z2}As$ second upper optical waveguide layer 21 does not exceed 0.5%.

Second Embodiment

Figure 2:
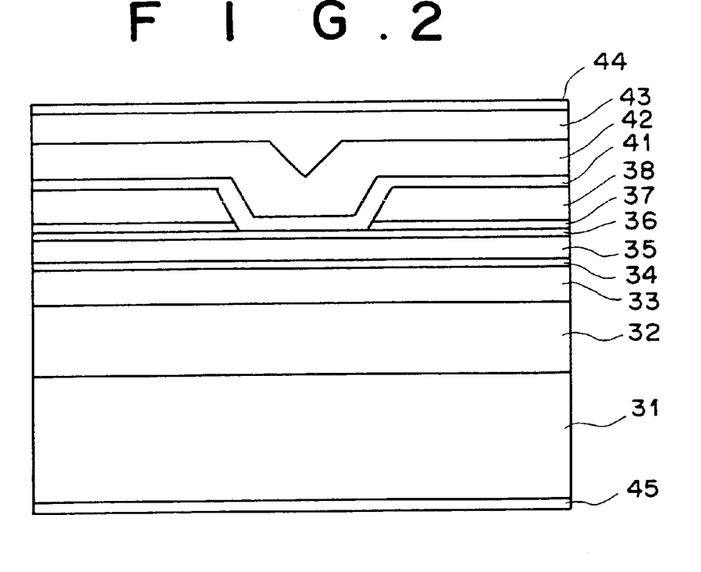
FIG. 2 is a cross-sectional view of a semiconductor laser device as a second embodiment of the present invention.

FIG. 2 is a cross-sectional view of a semiconductor laser device as the second embodiment of the present invention.

First, as illustrated in FIG. 2, an n-type $In_{0.49}Ga_{0.51}P$ lower cladding layer 32, an n-type or i-type (intrinsic) $In_{x2}Ga_{1-x2}As_{1-y2}P_{y2}$ lower optical waveguide layer 33 (x2= $(0.49\pm0.01)y2$, $0 \leq x2 \leq 0.3$), an $Inx_3Ga_{1-x3}As_{1-3}P_{y3}$ compressive strain quantum well active layer 34 ($0 < x3 < 0.4$, $0 \leq y3 \leq 0.1$), a p-type or i-type $In_{x2}Ga_{1-x2}As_{1-y2}P_{y2}$ first upper optical waveguide layer 35, a p-type $In_{x9}Ga_{1-x9}P$ first etching stop layer 36 ($0 \leq x9 \leq 1$) having a thickness of about 10 nm, a p-type $In_{x1}Ga_{1-x1}As_{1-y1}P_{y1}$ second etching stop layer 37 ($0 \leq x1 \leq 0.3$, $0 \leq y1 \leq 0.3$) having a thickness of about 10 nm, an n-type $In_{0.49}Ga_{0.51}P$ current confinement layer 38 having a thickness of about 1 micrometer, and an n-type GaAs cap 10 layer (not shown) having a thickness of about 10 nm are formed on an n-type GaAs substrate 31 by organometallic vapor phase epitaxy. Then, a $SiO_2$ film (not shown) is formed over the n-type GaAs cap layer, and a stripe area of the $SiO_2$ film having a width of about 1.5 to 3 micrometers and extending in the <011> direction is removed by conventional lithography.

Next, the n-type GaAs cap layer is etched with a sulfuric acid etchant by using the remaining areas of the $SiO_2$ film as a mask until a stripe area of the n-type $In_{0.49}Ga_{0.51}P$ current confinement layer 38 is exposed. Then, the exposed area of the n-type $In_{0.49}Ga_{0.51}P$ current confinement layer 38 is etched with a hydrochloric acid etchant until a stripe area of the p-type $In_{x1}Ga_{1-x1}As_{1-y1}P_{y1}$ second etching stop layer 37 is exposed.

Thereafter, the remaining areas of the $SiO_2$ film are removed by a fluoric acid etchant. Then, the remaining areas of the n-type GaAs cap layer and the exposed area of the p-type $In_{x1}Ga_{1-x1}As_{y-y1}P_{y1}$ second etching stop layer 37 are removed by etching with a sulfuric acid etchant so that a stripe area of the p-type $In_{x9}Ga_{1-x9}P$ first etching stop layer 36 is exposed.

Finally, a p-type $Al_2Ga_{1-z2}As$ second upper optical waveguide layer 41, a p-type Al0.53Ga0.47As upper cladding layer 42, and a p-type GaAs contact layer 43 are formed over the above construction. Then, a p electrode 44 is formed on the p-type GaAs contact layer 43. In addition, the exposed (opposite) surface of the substrate 31 is polished, and an n electrode 45 is formed on the polished surface of the substrate 31. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 35 and the p-type $Al_{z2}Ga_{1-z2}As$ second upper optical waveguide layer 41 have such thicknesses and compositions that oscillation in a fundamental transverse mode can be maintained even when output power becomes high. In other words, the p-type or i-type $In_{x2}Ga_{1-x2}As_{1-y2}P_{y2}$ first upper optical waveguide layer 35 and the p-type $Al_{z2}Ga_{1-z2}As$ second upper optical waveguide layer 41 have such thicknesses that an effective refractive index difference realized by the current confinement area and the light emission area becomes $1.5 \times 10^{-3}$ to $7 \times 10^{-3}$.

In addition, in order to realize the symmetry of the oscillation mode, it is preferable to arrange the p-type $Al_{z2}Ga_{1-z2}As$ second upper optical waveguide layer 41 to have a refractive index approximately identical to the refractive index of the p-type or i-type $In_{x2}Ga_{1-x2}As_{1-y2}P_{y2}$ first upper optical waveguide layer 35. Specifically, it is preferable that the difference in the refractive index between the p-type or i-type $In_{x2}Ga_{1-x2}As_{1-y2}P_{y2}$ first upper optical waveguide layer 35 and the p-type $Al_{z2}Ga_{1-z2}As$ second upper optical waveguide layer 41 does not exceed 0.5%.

Third Embodiment

Figure 3:
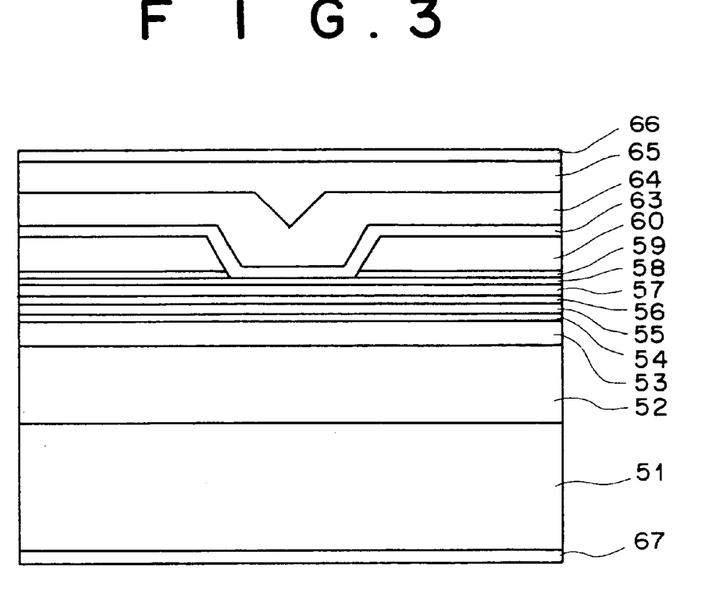
FIG. 3 is a cross-sectional view of a semiconductor laser device as a third embodiment of the present invention.

FIG. 3 is a cross-sectional view of a semiconductor laser device as the third embodiment of the present invention.

First, as illustrated in FIG. 3, an n-type $Al_{z1}Ga_{1-z1}As$ lower cladding layer 52 ($0.35 \leq z1 \leq 0.7$), an n-type or i-type (intrinsic) $Al_{z2}Ga_{1-z2}As$ lower optical waveguide layer 53 ($0 \leq z2 \leq 0.2$), an $In_{x5}Ga_{1-x5}As_{1-y5}P_{y5}$ tensile strain barrier layer 54 ($0 \leq x5 \leq 0.3$, $0 \leq y5 \leq 0.6$), an $In_{x3}Ga_{1-x3}As_{1-y3}P_{y3}$ compressive strain quantum well active layer 55 ($0 < x3 \leq 0.4$, $0 \leq y3 \leq 0.1$), an $In_{x5}Ga_{1-x5}As_{1-y5}P_{y5}$ tensile strain barrier layer 56 ($0 \leq x5 \leq 0.3$, $0 \leq y5 \leq 0.6$), a p-type or i-type $In_{x2}Ga_{1-x2}As_{1-y2}P_{y2}$ first upper optical waveguide layer 57 ($x2=(0.49 \pm 0.01)y2$, $0 \leq x2 \leq 0.3$), a p-type $In_{x9}Ga_{1-x9}P$ first etching stop layer 58 ($0 \leq x9 \leq 1$) having a thickness of about 10 nm, a p-type $In_{x1}Ga_{1-x1}As_{1-y1}P_{y1}$ second etching stop layer 59 ($x1=(0.49 \pm 0.01)y1$, $0 \leq x1 \leq 0.3$) having a thickness of about 10 nm, an n-type $In_{0.49}Ga_{0.51}P$ current confinement layer 60 having a thickness of about 1 micrometer, and an n-type GaAs cap layer (not shown) having a thickness of about 10 nm are formed on an n-type GaAs substrate 51 by organometallic vapor phase epitaxy. Then, a $SiO_2$ film (not shown) is formed over the n-type GaAs cap layer, and a stripe area of the $SiO_2$ film having a width of about 1.5 to 3 micrometers and extending in the <011> direction is removed by conventional lithography.

Next, the n-type GaAs cap layer is etched with a sulfuric acid etchant by using the remaining areas of the $SiO_2$ film as a mask until a stripe area of the n-type $In_{0.49}Ga_{0.51}P$ current confinement layer 60 is exposed. Then, the exposed area of the n-type $In_{0.49}Ga_{0.51}P$ current confinement layer 60 is etched with a hydrochloric acid etchant until a stripe area of the p-type $In_{x1}Ga_{1-x1}As_{1-y1}P_{y1}$ second etching stop layer 59 is exposed.

Thereafter, the remaining areas of the $SiO_2$ film are removed by a fluoric acid etchant. Then, the remaining areas of the n-type GaAs cap layer and the exposed area of the p-type $In_{x1}Ga_{1-x1}As_{1-y1}P_{y1}$ second etching stop layer 59 are removed by etching with a sulfuric acid etchant so that stripe area of the p-type $In_{x9}Ga_{1-x9}P$ first etching stop layer 58 is exposed.

Finally, a p-type $Al_2Ga_{1-z2}As$ second upper optical waveguide layer 63, a p-type $In_{x4}Ga_{1-x4}As_{1-y4}P_{y4}$ upper cladding layer 64 ($x4=(0.49 \pm 0.01)y4$, $0.9 \leq y4 \leq 1$), and a p-type GaAs contact layer 65 are formed over the above construction. Then, a p electrode 66 is formed on the p-type GaAs contact layer 65. In addition, the exposed (opposite) surface of the substrate 51 is polished, and an n electrode 67 is formed on the polished surface of the substrate 51. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 57 and the p-type $Al_2Ga_{1-z2}As$ second upper optical waveguide layer 63 have such thicknesses and compositions that oscillation in a fundamental transverse mode can be maintained even when output power becomes high. In other words, the p-type or i-type $In_{x2}Ga_{1-x2}As_{1-y2}P_{y2}$ first upper optical waveguide layer 57 and the p-type $Al_{z2}Ga_{1-z2}As$ second upper optical waveguide layer 63 have such thicknesses that an effective refractive index difference realized by the current confinement area and the light emission area becomes $1.5 \times 10^{-3}$ to $7 \times 10^{-3}$.

In addition, in order to realize the symmetry of the oscillation mode, it is preferable to arrange the p-type $Al_{z2}Ga_{1-z2}As$ second upper optical waveguide layer 63 to have a refractive index approximately identical to the refractive index of the p-type or i-type $In_{x2}Ga_{1-x2}As_{1-y2}P_{y2}$ first upper optical waveguide layer 57. Specifically, it is preferable that the difference in the refractive index between the p-type or i-type $In_{x2}Ga_{1-x2}As_{1-y2}P_{y2}$ first upper optical waveguide layer 57 and the p-type $Al_2Ga_{1-z2}As$ second upper optical waveguide layer 63 does not exceed 0.5%.

Although the GaAs cap layer is formed in the first to third embodiments, the semiconductor laser device according to the present invention can be produced without a cap layer. When a GaAs cap layer is formed as in the first to third embodiments, it is possible to prevent formation of a natural oxidation film on the InGaP current confinement layer, and metamorphic change in the InGaP current confinement layer, which may occur when a resist layer is formed directly on the InGaP current confinement layer. In addition, since the GaAs cap layer is removed before the second upper optical waveguide layer is formed, it is possible to remove a residue left on the regrowth layer on which the second upper optical waveguide layer is formed, and prevent occurrence of crystal defects.

Fourth Embodiment

Figure 4:
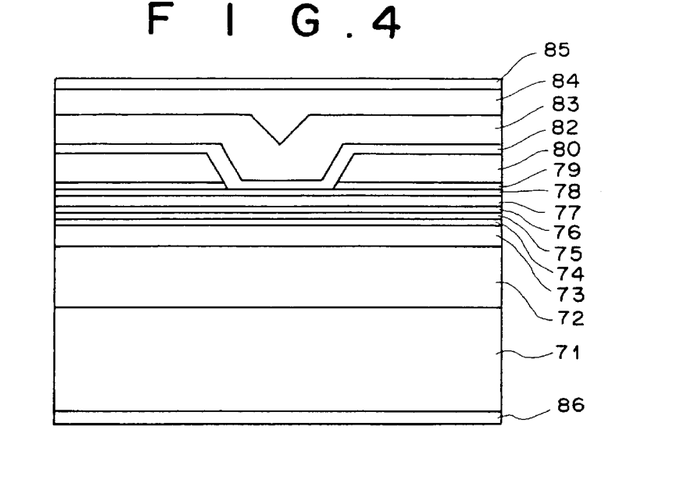
FIG. 4 is a cross-sectional view of a semiconductor laser device as a fourth embodiment of the present invention.

FIG. 4 is a cross-sectional view of a semiconductor laser device as the fourth embodiment of the present invention.

First, as illustrated in FIG. 4, an n-type $In_{0.49}Ga_{0.51}P$ lower cladding layer 72, an n-type or i-type (intrinsic) $In_{x2}Ga_{1-x2}As_{1-y2}P_{y2}$ lower optical waveguide layer 73 ($x2=(0.49 \pm 0.01)y2$, $0 \leq x2 \leq 0.3$), an $In_{x5}Ga_{1-x5}As_{1-y5}P_{y5}$ tensile strain barrier layer 74 ($0 \leq x5 \leq 0.3$, $0 \leq y5 \leq 0.6$), an $In_{x3}Ga_{1-x3}As_{1-y3}P_{y3}$ compressive strain quantum well active layer 75 ($0 \leq x3 \leq 0.4$, $0 \leq y3 \leq 0.1$), an $In_{x5}Ga_{1-x5}As_{1-y5}P_{y5}$ tensile strain barrier layer 76 ($0 \leq x5 \leq 0.3$, $0 \leq y5 \leq 0.6$), a p-type or i-type $In_{x2}Ga_{1-x2}As_{1-y2}P_{y2}$ first upper optical waveguide layer 77 ($x2=(0.49 \pm 0.01)y2$, $0 \leq x2 \leq 0.3$), a p-type $In_{x9}Ga_{1-x9}P$ first etching stop layer 78 ($0 \leq x9 \leq 1$) having a thickness of about 10 nm, a p-type $In_{x1}Ga_{1-x1}As_{1-y1}P_{y1}$ second etching stop layer 79 ($0 \leq x1 \leq 0.3$, $0 \leq y1 \leq 0.3$) having a thickness of about 10 nm, and an n-type $In_{0.49}Ga_{0.51}P$ current confinement layer 80 having a thickness of about 1 micrometer are formed on an n-type GaAs substrate 71 by organometallic vapor phase epitaxy. Then, a $SiO_2$ film (not shown) is formed over the n-type $In_{0.49}Ga_{0.51}P$ current confinement layer 80, and a stripe area of the $SiO_2$ film having a width of about 1.5 to 3 micrometers and extending in the <011> direction is removed by conventional lithography.

Next, the n-type $In_{0.49}Ga_{0.51}P$ current confinement layer 80 is etched with a hydrochloric acid etchant by using the remaining areas of the $SiO_2$ film as a mask until a stripe area of the p-type $In_{x1}Ga_{1-x1}As_{1-y1}P_{y1}$ second etching stop layer 79 is exposed.

Thereafter, the remaining areas of the $SiO_2$ film are removed by a fluoric acid etchant. Then, the exposed area of the p-type $In_{x1}Ga_{1-x1}As_{1-y1}P_{y1}$ second etching stop layer 79 is removed by etching with a sulfuric acid etchant so that a stripe area of the p-type $In_{x9}Ga_{1-x9}P$ first etching stop layer 78 is exposed.

Finally, a p-type $Al_{z2}Ga_{1-z2}As$ second upper optical waveguide layer 82, a p-type $In_{x4}Ga_{1-x4}As_{1-y4}P_{y4}$ upper cladding layer 83 (x4=(0.49±0.01)y4, 0.9≦y4≦1), and a p-type GaAs contact layer 84 are formed over the above construction. Then, a p electrode 85 is formed on the p-type GaAs contact layer 84. In addition, the exposed (opposite) surface of the substrate 71 is polished, and an n electrode 86 is formed on the polished surface of the substrate 71. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 77 and the p-type $Al_{z2}Ga_{1-z2}As$ second upper optical waveguide layer 82 have such thicknesses and compositions that oscillation in a fundamental transverse mode can be maintained even when output power becomes high. In other words, the p-type or i-type $In_{x2}Ga_{1-x2}As_{1-y2}P_{y2}$ first upper optical waveguide layer 77 and the p-type $Al_{z2}Ga_{1-z2}As$ second upper optical waveguide layer 82 have such thicknesses that an effective refractive index difference realized by the current confinement area and the light emission area becomes $1.5 \times 10^{-3}$ to $7 \times 10^{-3}$.

In addition, in order to realize the symmetry of the oscillation mode, it is preferable to arrange the p-type $Al_{z2}Ga_{1-z2}As$ second upper optical waveguide layer 82 to have a refractive index approximately identical to the refractive index of the p-type or i-type $In_{x2}Ga_{1-x2}As_{1-y2}P_{y2}$ first upper optical waveguide layer 77. Specifically, it is preferable that the difference in the refractive index between the p-type or i-type $In_{x2}Ga_{1-x2}As_{1-y2}P_{y2}$ first upper optical waveguide layer 77 and the p-type $Al_{z2}Ga_{1-z2}As$ second upper optical waveguide layer 82 does not exceed 0.5%.

Temperature Dependency of Threshold Current

Temperature dependencies of threshold currents in semiconductor laser devices according to the present invention are compared with a temperature dependency of a threshold current in a conventional semiconductor laser device. Specifically, the semiconductor laser devices as the first and second embodiments of the present invention are used in this comparison. In each of the semiconductor laser devices as the first and second embodiments of the present invention used in this comparison, the second upper optical waveguide layers are made of $Al_{0.11}Ga_{0.89}As$, the first upper optical waveguide layers are made of $In_{0.11}Ga_{0.89}As_{0.77}P_{0.23}$, and the total thickness of the optical waveguide layers is 0.8 micrometers. On the other hand, in the conventional semiconductor laser device used in the comparison, the second upper optical waveguide layer is made of InGaAsP. All of semiconductor laser devices as the first and second embodiments of the present invention and the conventional semiconductor laser device used in the comparison have a stripe width of 2.5 micrometers and an oscillation wavelength of 1060 nm.

Figure 5:
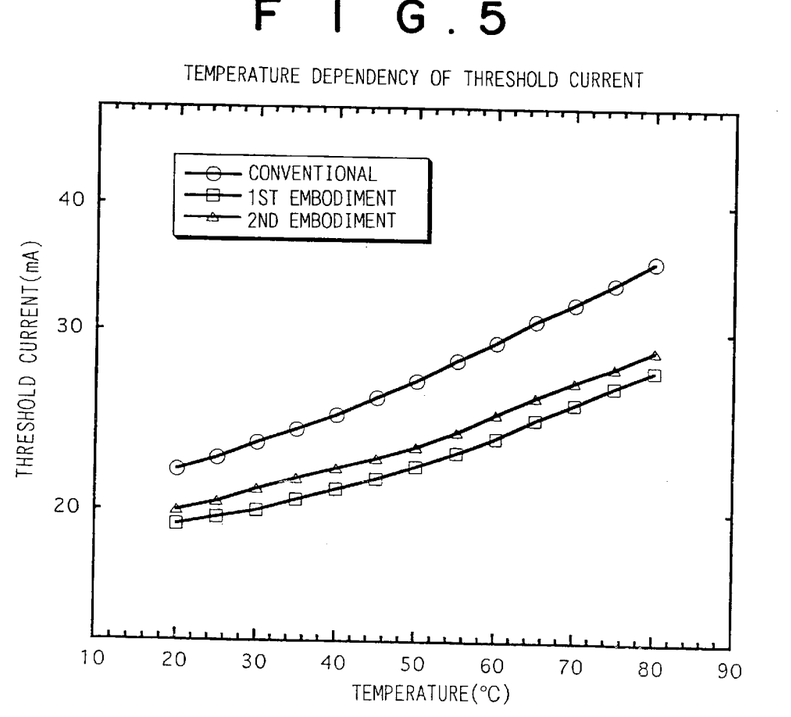
FIG. 5 is a graph indicating temperature dependencies of threshold currents in a conventional semiconductor laser device and semiconductor laser devices as the first and second embodiments of the present invention.

FIG. 5 is a graph indicating the temperature dependencies of the threshold currents in the conventional semiconductor laser device and the semiconductor laser devices as the first and second embodiments of the present invention. As indicated in FIG. 5, the semiconductor laser devices as the first and second embodiments of the present invention have lower threshold currents and smaller temperature dependencies of the threshold current than the conventional semiconductor laser device.

In addition, the temperature dependency of the threshold current in the semiconductor laser device as the second embodiment of the present invention is slightly smaller than that in the semiconductor laser device as the first embodiment of the present invention, where the upper cladding layer of the semiconductor laser device as the second embodiment of the present invention is made of AlGaAs, and the upper cladding layer of the semiconductor laser device as the first embodiment of the present invention is made of InGaP.

Variations and Other Matters (i) It is possible to form an $In_{0.49}Ga_{0.51}P$ layer having a thickness of about 20 nm before the second upper optical waveguide layer is formed in the process for producing the semiconductor laser device according to the present invention. In this case, the leakage current can be more effectively suppressed.

(ii) Since the temperature dependencies are reduced in the semiconductor laser devices according to the present invention, and the semiconductor laser devices can emit a highly reliable laser beam, the semiconductor laser devices according to the present invention can be used in the fields of high-speed, information processing, image processing, communications, laser measurement, medicine, printing, and the like.

(iii) Since the compressive strain quantum well active layers are made of $In_{x3}Ga_{1-x3}As_{1-y3}P_{y3}$ (0<x3≦0.4, 0≦y3≦0.1), the oscillation wavelengths of the semiconductor laser devices as the first to fourth embodiments can be controlled in the range of 900 to 1,200 nm.

(iv) Although n-type GaAs substrates are used in the constructions of the first to fourth embodiments, instead, p-type GaAs substrates may be used. When the GaAs substrates are p-type, the conductivity types of all of the other layers in the constructions of the first to fourth embodiments should be inverted.

(v) Each layer in the constructions of the first to fourth embodiments may be formed by molecular beam epitaxy using solid or gas raw material.

(vi) Although the constructions of the first to fourth embodiments are index-guided structure semiconductor laser devices, the present invention can also be used in semiconductor laser devices having a diffraction grating and optical integrated circuits.

(vii) Although each of the semiconductor laser devices as the first to fourth embodiments has a stripe width of 1.5 to 3 micrometers, and oscillates in a fundamental transverse mode, the present invention can also be applied to broad-stripe index-guided semiconductor laser devices each having a stripe width of 3 micrometers or more and oscillating in multiple modes. According to the present invention, it is possible to realize a semiconductor laser device which produces low noise even in a multimode operation.

What is claimed is:

1. A semiconductor laser device comprising:

a GaAs substrate of a first conductive type;

a lower cladding layer of said first conductive type having a first refractive index and being formed above said GaAs substrate;

a lower optical waveguide layer formed above said lower cladding layer;

a compressive strain quantum well active layer made of $In_{x3}Ga_{1-x3}As_{1-y3}P_{y3}$ and formed above said lower optical waveguide layer, where $0<x3\leq0.4$ and $0\leq y3\leq0.1$;

a first upper optical waveguide layer made of $In_{x2}Ga_{1-x2}As_{1-y2}P_{y2}$ and formed above said compressive strain quantum well active layer, where $x2=(0.49\pm0.01)y2$, $0\leq x2\leq0.3$, and said first upper optical waveguide layer has a second refractive index;

a first etching stop layer made of $In_{x9}Ga_{1-x9}P$ of a second conductive type and formed above said first upper optical waveguide layer, where $0\leq x9\leq1$;

a second etching stop layer made of $In_{x1}Ga_{1-x1}As_{1-y1}P_{y1}$ and formed on said first etching stop layer other than a stripe area of the first etching stop layer so as to form a first portion of a stripe groove realizing a current injection window, where $x1=(0.49\pm0.01)y1$ and $0\leq x1\leq0.3$;

a current confinement layer made of $In_{0.49}Ga_{0.51}P$ of the first conductive type and formed above said second etching stop layer so as to form a second portion of said stripe groove;

a second upper optical waveguide layer made of AlGaAs formed so as to cover said current confinement layer and said stripe groove;

an upper cladding layer of said second conductive type, made of one of AlGaAs and $In_{x4}Ga_{1-x4}As_{1-y4}P_{y4}$ and formed over said second upper optical waveguide layer, where $x4=(0.49\pm0.01)y4$, $0.9\leq y4\leq1$;

a contact layer of said second conductive type;

a first electrode formed on an exposed surface of said GaAs substrate; and a second electrode formed on said contact layer;

wherein an absolute value of a first product of a first strain and a thickness of said compressive strain quantum well active layer is equal to or smaller than 0.25 nm, and each of said lower cladding layer, said lower optical waveguide layer, said first and second upper optical waveguide layers, said first and second etching stop layers, said current confinement layer, said upper cladding layer, and said contact layer has such a composition as to lattice-match with GaAs.

2. A semiconductor laser device according to claim 1, further comprising first and second tensile strain barrier layers both made of $In_{x5}Ga_{1-x5}As_{1-y5}P_{y5}$ and respectively formed above and below said compressive strain quantum well active layer, where $0\leq x5\leq0.3$ and $0\leq y5\leq0.6$; and an absolute value of a sum of said first product and a second product of a second strain of said first and second tensile strain barrier layers and a total thickness of the first and second tensile strain barrier layers is equal to or smaller than 0.25 nm.

3. A semiconductor laser device according to claim 1, wherein said second etching stop layer is one of said first and second conductive types.

4. A semiconductor laser device according to claim 1, wherein said lower optical waveguide is of first conductive type.

5. A semiconductor laser device according to claim 1, wherein said upper cladding layer consists of one of AlGaAs, InGaAsP and InGaP.

6. A semiconductor laser device comprising:

a GaAs substrate of a first conductive type;

a lower cladding layer of said first conductive type having a first refractive index and being formed above said GaAs substrate;

a lower optical waveguide layer formed above said lower cladding layer;

a compressive strain quantum well active layer made of $In_{x3}Ga_{1-x3}As_{1-y3}P_{y3}$ and formed above said lower optical waveguide layer, where $0\leq x3\leq0.4$ and $0\leq y3\leq0.1$;

a first upper optical waveguide layer made of $In_{x2}Ga_{1-x2}As_{1-y2}P_{y2}$ and formed above said compressive strain quantum well active layer, where $x2=(0.49\pm0.01)y2$, $0\leq x2\leq0.3$, and said first upper optical waveguide layer has a second refractive index;

a first etching stop layer made of $In_{x9}Ga_{1-x9}P$ of a second conductive type and formed above said first upper optical waveguide layer, where $0\leq x9\leq1$;

a second etching stop layer made of $In_{x1}Ga_{1-x1}As_{1-y1}P_{y1}$ and formed on said first etching stop layer other than a stripe area of the first etching stop layer so as to form a first portion of a stripe groove realizing a current injection window, where $x1=(0.49\pm0.01)y1$ and $0\leq x1\leq0.3$;

a current confinement layer made of $In_{0.49}Ga_{0.51}P$ of the first conductive type and formed above said second etching stop layer so as to form a second portion of said stripe groove;

a second upper optical waveguide layer made of AlGaAs formed so as to cover said current confinement layer and said stripe groove, wherein said second upper optical waveguide layer has a third refractive index which is at most 0.5% different from said second refractive index;

an upper cladding layer of said second conductive type, made of one of AlGaAs and $In_{x4}Ga_{1-x4}As_{1-y4}P_{y4}$ and formed over said second upper optical waveguide layer, where $x4=(0.49\pm0.01)y4$, $0.9\leq y4\leq1$ and wherein said upper cladding layer has a fourth refractive index is at most 0.5% different from said first refractive index;

a contact layer of said second conductive type;

a first electrode formed on an exposed surface of said GaAs substrate; and a second electrode formed on said contact layer;

wherein an absolute value of a first product of a first strain and a thickness of said compressive strain quantum well active layer is equal to or smaller than 0.25 nm, and each of said lower cladding layer, said lower optical waveguide layer, said first and second upper optical waveguide layers, said first and second etching stop layers, said current confinement layer, said upper cladding layer, and said contact layer has such a composition as to lattice-match with GaAs.

7. A semiconductor laser device according to claim 6, further comprising first and second tensile strain barrier layers both made of $In_{x5}Ga_{1-x5}As_{1-y5}P_{y5}$ and respectively formed above and below said compressive strain quantum well active layer, where $0 \leq x5 \leq 0.3$ and $0 \leq y5 \leq 0.6$; and an absolute value of a sum of said first product and a second product of a second strain of said first and second tensile strain barrier layers and a total thickness of the first and second tensile strain barrier layers is equal to or smaller than 0.25 nm.

8. A semiconductor laser device according to claim 6, wherein said second etching stop layer is one of said first and second conductive types.

9. A semiconductor laser device according to claim 6, wherein said lower optical waveguide is of first conductive type.

10. A semiconductor laser device according to claim 6, wherein said upper cladding layer consists of one of AlGaAs, InGaAsP and InGaP.

11. A semiconductor laser device according to claim 1, wherein a difference in the equivalent refractive index of the first upper optical waveguide layer and the second upper optical waveguide layer between a portion of the active region under the current injection window and another portion of the active region under the current confinement layer ranges from $1.5 \times 10^{-3}$ to $7 \times 10^{-3}$.

* * * * *